(12) United States Patent
Sapra et al.

(10) Patent No.: US 8,283,259 B2
(45) Date of Patent: Oct. 9, 2012

(54) METHODS OF REMOVING A METAL NITRIDE MATERIAL

(75) Inventors: Sanjeev Sapra, Boise, ID (US); Janos Fucsko, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 12/872,564

(22) Filed: Aug. 31, 2010

(65) Prior Publication Data

US 2012/0052678 A1  Mar. 1, 2012

(51) Int. Cl.
*H01L 21/461* (2006.01)
*H01L 21/302* (2006.01)

(52) U.S. Cl. ............... 438/754; 438/689; 438/742

(58) Field of Classification Search ............ 438/754, 438/689, 742
See application file for complete search history.

(56) References Cited

U.S. PATENT DOCUMENTS

| | | | |
|---|---|---|---|
| 5,364,817 A * | 11/1994 | Lur et al. | 438/644 |
| 5,776,833 A * | 7/1998 | Chen et al. | 438/672 |
| 6,240,933 B1 | 6/2001 | Bergman | |
| 6,426,287 B2 * | 7/2002 | Blalock et al. | 438/629 |
| 6,634,368 B1 | 10/2003 | Jung et al. | |
| 6,720,271 B2 | 4/2004 | Bellandi et al. | |
| 6,790,786 B2 | 9/2004 | Morgan et al. | |
| 7,244,682 B2 * | 7/2007 | Shea et al. | 438/745 |
| 7,276,455 B2 * | 10/2007 | Shea | 438/745 |
| 7,683,020 B2 | 3/2010 | Shea et al. | |
| 2003/0116174 A1 | 6/2003 | Park et al. | |
| 2006/0263971 A1 | 11/2006 | Lee et al. | |
| 2007/0004218 A1 | 1/2007 | Lee et al. | |
| 2009/0095321 A1 | 4/2009 | Kim et al. | |

OTHER PUBLICATIONS

Chen, The Application of DI-O3 Water on Wafer Surface Preparation, International Conference on Wafer Rinsing, Water Reclamation and Environmental Technology for Semiconduct Manufacturing, www.ozomax.com/pdf/dio3prep.pdf (1999) 10 pages.
Kim et al., A New Alloy Design Concept for Austenitic Stainless Steel with Tungsten Modification for Bipolar Plate Application in PEMFC, Journal of Power Sources (2007) vol. 173, pp. 917-924.
Klaris, Physical Properties of Oxygen and Ozone, http://www.klaris.ca/ozone-informaiton, Nov. 19, 2009, 2 pages.
Lillard et al., The Nature of Oxide Films on Tungsten in Acidic and Alkaline Solutions, http://public.lanl.gov/MCEL/PDF-Publications/W-SERS.pdf, (1998), 38 pages.
MKS Technology for Productivity, Liquozon Ultra, Ozonated Di Water System Safe, Efficient Di Water Loop and Storage Tank Sanitization with Ozone, www.mksinst.com/docs/UR/liquozonUltraDS.pdf, Feb. 2009, 4 pages.

* cited by examiner

Primary Examiner — Luan C Thai
(74) Attorney, Agent, or Firm — TraskBritt

(57) ABSTRACT

A method of removing a metal nitride material is disclosed. The method comprises forming a semiconductor device structure comprising an exposed metal material and an exposed metal nitride material. The semiconductor device structure is subjected to a solution comprising water, ozone, and at least one additive to remove the exposed metal nitride material at a substantially greater rate than the exposed metal material.

16 Claims, 2 Drawing Sheets

METHODS OF REMOVING A METAL NITRIDE MATERIAL

TECHNICAL FIELD

Embodiments of the present invention relate to semiconductor fabrication and, more specifically, to methods of selectively removing a metal nitride material relative to a metal material.

BACKGROUND

As dynamic random access memory (DRAM) feature sizes shrink to 4× or below, plug contact resistance increases due to a decrease in the size of a capacitor contact. To address this issue, tungsten (W) is being explored as a replacement for polysilicon for capacitor contacts. One advantage of using tungsten as a contact material is that reduced contact resistance and increased device speed are achieved, and stringent higher cell capacitance requirements are met. When tungsten is used as the contact material, a liner formed from titanium/titanium nitride (Ti/TiN) is conventionally used to provide improved adhesion and lower resistance to the contact due to the formation of titanium silicide ($TiSi_2$) with the underlying polysilicon. During fabrication of the plug contacts, the titanium/titanium nitride is used as the liner in an opening in a dielectric material. Following formation of the liner, tungsten is deposited in the opening, such as by using a chemical vapor deposition (CVD) process. A chemical-mechanical planarization (CMP) process is performed to remove excess tungsten from the substrate surface and to planarize the exposed surfaces of the tungsten and titanium/titanium nitride within the opening.

After the CMP process, the tungsten and titanium/titanium nitride are removed by a dry etch process or a wet etch process to completely isolate the tungsten to prevent shorting of the plug contacts. However, conventional dry etch processes have low selectivity between the tungsten and a silicon nitride ($Si_3N_4$) material, which is used as an etch stop in the fabrication of the capacitor and also prevents shorts. Therefore, when the tungsten material is removed by the dry etch process, all or a portion of the silicon nitride material is also removed. The thinning of this silicon nitride material has downstream process implications. Another disadvantage of conventional dry etch processes is that the titanium/titanium nitride material cannot be isotropically etched from sidewalls of the tungsten material and the top of the silicon nitride material, which leads to poor isolation of the tungsten plugs. Conventional wet etch solutions, such as those that contain ammonium hydroxide or hydrogen peroxide, have minimal selectivity between the tungsten material and the titanium/titanium nitride material. When utilizing the conventional wet etch solutions to remove the titanium/titanium nitride material, the tungsten material is also entirely removed. Regardless of the hydrogen peroxide concentration, aqueous solutions of hydrogen peroxide exhibit low etch rates of the tungsten material and titanium/titanium nitride material.

Wet etch solutions that include ozone are known in the art. Ozone-containing solutions have been used to etch a metal nitride material relative to silicon, silicon dioxide, silicon nitride, or doped silicon oxides. Ozone-containing solutions have also been used to remove contaminants from silicon wafers, such as to remove inorganic or organic residues and particles.

It would be desirable to be able to selectively remove metal nitride materials on semiconductor device structures having both metal and metal nitride materials.

DETAILED DESCRIPTION

Figure 1:
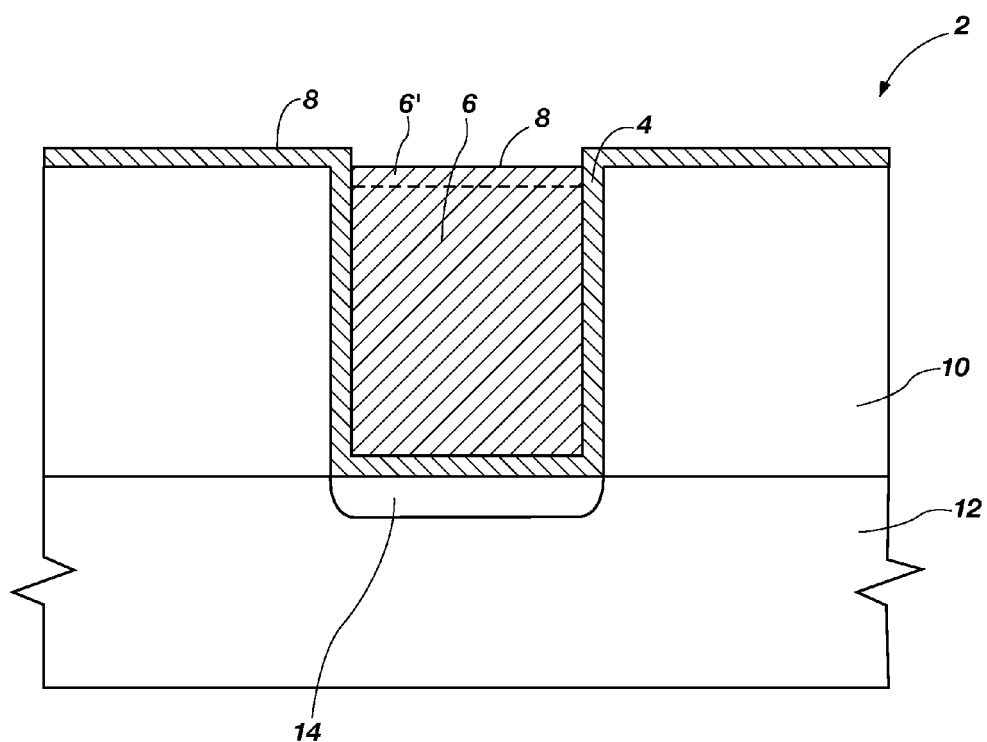
FIG. 1 is a cross-sectional view of a semiconductor device structure according to an embodiment of the present invention.

Methods of selectively removing metal nitride materials relative to metal materials are disclosed, as are oxidizing solutions for removing the metal nitride materials. The metal nitride material and the metal material may both be present and exposed on a semiconductor device structure. As used herein, the term "exposed" means and includes a material having at least a portion thereof that is uncovered or otherwise not protected by another material. Since the metal nitride material and the metal material are both exposed on the semiconductor device structure, when the semiconductor device structure is subjected to the oxidizing solution, both of the materials come into contact with the oxidizing solution. The semiconductor device structure may be contacted with the oxidizing solution to selectively etch the metal nitride material while the metal material remains substantially unetched. While both the metal nitride material and the metal material are subjected to the same etch chemistry, the metal nitride material may be etched at an etch rate of at least approximately two times greater than that of the metal material. By way of example, the metal nitride material may exhibit an etch rate of at least approximately ten times greater than that of the metal material. The oxidizing solution includes water, ozone, and at least one additive. The oxidizing solution may modulate the etch selectivity for the metal material and the metal oxide material.

The following description provides specific details, such as material types and processing conditions in order to provide a thorough description of embodiments of the present invention. However, a person of ordinary skill in the art would understand that the embodiments of the present invention may be practiced without employing these specific details. Indeed, the embodiments of the present invention may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present invention are described in detail below. Additional acts to form the complete semiconductor device from the semiconductor device structures may be performed by conventional fabrication techniques.

The illustrations presented herein are not meant to be actual views of any particular semiconductor device structure, but are merely idealized representations that are employed to describe the present invention. The figures are not necessarily drawn to scale.

The oxidizing solution may be an aqueous solution that includes ozone and an additive or additives. As used herein, each of the terms "additive" and "at least one additive" includes and encompasses a single additive as well as multiple-component additives. To facilitate oxidation of the metal material, the oxidizing solution may have a pH of less than approximately 4, such as a pH of less than approximately 2. The pH of the oxidizing solution may be controlled based on the selection of the additive. The water of the oxidizing solution may be of sufficient purity to be used in semiconductor fabrication, such as deionized water (DI $H_2O$), ultrapure water, or water purified by reverse osmosis. In one embodiment, the water is DI $H_2O$.

The oxidizing solution may include from approximately 5 parts per million (ppm) of ozone to approximately 100 ppm of ozone, such as from approximately 10 ppm of ozone to approximately 40 ppm of ozone. In one embodiment, the oxidizing solution includes approximately 10 ppm of ozone. In another embodiment, the oxidizing solution includes approximately 40 ppm of ozone. The ozone may be generated by conventional techniques, such as from oxygen gas, which techniques are not discussed in detail herein.

The additive may include, but is not limited to, hydrogen fluoride, ammonium hydroxide, hydrochloric acid, hydrogen peroxide, tetramethylammonium hydroxide, and combinations thereof. Sulfuric acid or phosphoric acid may be present as optional additives. In one embodiment, the additive is hydrogen fluoride. In another embodiment, the additive is a mixture of hydrogen fluoride and hydrogen chloride. In yet another embodiment, the additive is ammonium hydroxide. The additive may be present in the oxidizing solution at from approximately 0.1% by weight (wt %) to approximately 10 wt %. By way of example, if the additive is hydrochloric acid, the additive may be present at from approximately 0.1 wt % to approximately 10 wt %. If the additive is hydrogen fluoride, the additive may be present at from approximately 0.1 wt % to approximately 1.0 wt %.

The oxidizing solution may be produced by combining the ozone and the additive in water, such as with stirring. By way of example, the ozone may be purged into the water and a solution of the additive added thereto. Since the solubility of ozone in water decreases as the temperature of the water increases, the water may be maintained at a temperature of from approximately 20° C. to approximately 25° C. (room temperature) during preparation of the oxidizing solution to ensure that sufficient amounts of ozone and the additive are present in the water.

The oxidizing solution may be used to selectively remove the exposed metal nitride material from the semiconductor device structure without substantially removing the exposed metal material. The semiconductor device structure may be an intermediate semiconductor device structure produced during the fabrication of a semiconductor device. The metal material of the semiconductor device structure may be a transition metal material including, but not limited to, titanium, vanadium, nickel, copper, zinc, zirconium, niobium, molybdenum, ruthenium, rhodium, cadmium, lanthanum, hafnium, tantalum, or tungsten. The metal nitride material may include, but is not limited to, titanium nitride (TiN), tantalum nitride, or tungsten nitride.

In one embodiment, the semiconductor device structure is an intermediate semiconductor device structure formed during the fabrication of a DRAM structure or NAND structure. The semiconductor device structure may include a metal feature and a metal nitride feature, both of which are exposed. The metal feature may be a contact, such as a conductive plug, formed from the metal material and the metal nitride feature may be a liner formed from the metal nitride material. In one embodiment, the metal feature is formed from tungsten and the metal nitride feature is formed from titanium nitride. As shown in FIG. 1, the semiconductor device structure 2 may include the metal nitride material 4 and the metal material 6, both of which have exposed surfaces 8. The semiconductor device structure 2 may be fabricated by conventional techniques, which are not described in detail herein. By way of example, the semiconductor device structure 2 may include an opening (not shown) formed in an insulative material 10 on a semiconductor substrate 12. As used herein, the term "semiconductor substrate" refers to a conventional silicon substrate or other bulk substrate having a layer of semiconductor material. As used herein, the term "bulk substrate" includes not only silicon wafers, but also silicon-on-insulator ("SOI") substrates, silicon-on-sapphire ("SOS") substrates, epitaxial layers of silicon on a base semiconductor foundation, and other semiconductor or optoelectronics materials, such as silicon-germanium, germanium, gallium arsenide, or indium phosphide. The semiconductor substrate 12 may, optionally, include other materials (not shown), such as materials from previous acts conducted during the fabrication of the semiconductor device structure 2. The insulative material 10 may be a silicon oxide or a doped silicon oxide, such as borophosphosilicate glass (BPSG). A liner formed from the metal nitride material 4 may be formed in the opening. The remainder of the opening may be filled with the metal material 6, which functions as the contact. The metal material 6 and the metal nitride material 4 may provide contact with conductor 14. In the semiconductor device structure 2, the exposed surfaces 8 of the metal nitride material 4 and the metal material 6 may be surfaces on the top of the semiconductor device structure 2.

The semiconductor device structure 2 may be subjected to the oxidizing solution to remove the metal nitride material 4 without substantially removing the metal material 6 or the insulative material 10. After removing the metal nitride material 4, the semiconductor device structure 2 may include a gap (not shown) between the metal material 6 and the insulative material 10 in the previous location of the metal nitride material 4. The insulative material 10 may subsequently be removed, such as by conventional techniques, which are not described in detail herein. The semiconductor device structure 2 having the metal material 6 remaining on the substrate 12 may then be subjected to additional processing acts to form the DRAM structure or NAND structure. While the semiconductor device structure 2 is described herein as being an intermediate structure in the formation of a DRAM structure or NAND structure, the oxidizing solution may be used with other semiconductor device structures having the exposed metal nitride material and the exposed metal material where etch selectivity between the exposed metal nitride material and the exposed metal material is desired. By way of example, the oxidizing solution may also be used with semiconductor device structures having multiple conductive materials exposed on the semiconductor device structure.

To selectively etch the metal nitride material 4, the oxidizing solution may be applied to the semiconductor device structure 2, such as by immersion or non-immersion techniques including, but not limited to, dipping or spraying. During the application, the oxidizing solution may be maintained at approximately room temperature. In one embodiment, the semiconductor device structure 2 is immersed in the oxidizing solution. The semiconductor device structure 2 may be contacted with the oxidizing solution for an amount of time sufficient for the metal nitride material 4 to be etched while the metal material 6 remains substantially unetched. By way of example, the semiconductor device structure 2 may be contacted with the oxidizing solution for an amount of time ranging from approximately one minute to approximately ninety minutes, such as from approximately two minutes to approximately sixty-four minutes to etch the metal nitride material 4.

The semiconductor device structure 2 may be positioned in an apparatus configured to apply the oxidizing solution to the semiconductor device structure 2. The apparatus may include a tank in which the semiconductor device structure 2 is placed. The tank may be configured to contain a single semiconductor device structure 2 or a plurality of semiconductor device structures 2, enabling the metal nitride material 4 to be removed as a continuous process or a batch process. Such apparatuses are known in the art and, therefore, are not described in detail herein. Each of the water, ozone, and the additive of the oxidizing solution may be introduced into the tank of the apparatus to contact the semiconductor device structure 2 with the components of the oxidizing solution. A water supply may be coupled to the apparatus and the water of the oxidizing solution may be introduced into the tank through an injection port. Similarly, an additive supply may be coupled to the apparatus and the additive may be introduced into the tank through an injection port. If the additive is a liquid at room temperature, the additive supply may be neat additive. If the additive is a solid at room temperature, the additive supply may be a solution of the additive, such as an aqueous solution of the additive. A combined water/additive supply may also be produced outside of the apparatus and then introduced into the tank through an injection port. An ozone generator may also be coupled to the tank for providing ozone to the tank. The ozone of the oxidizing solution may be injected into the tank through an injection port.

The components of the oxidizing solution may be introduced into the tank of the apparatus, immersing the semiconductor device structure 2 in the oxidizing solution. Each of the water, ozone, and the additive may be sequentially introduced into the tank at a sufficient flowrate to achieve the desired concentration of ozone and the additive in the oxidizing solution. The concentration of the ozone and the additive in the oxidizing solution may be easily changed by adjusting the flowrate of the ozone and additive. Depending on the configuration of the apparatus, the oxidizing solution may also be introduced into the apparatus as a single solution that includes water, ozone, and the additive. Upon contact with the oxidizing solution, the metal nitride material 4 on the semiconductor device structure 2 may be etched while the metal material 6 remains substantially unetched.

Without being bound to a particular theory, it is believed that the ozone in the oxidizing solution oxidizes a portion of the metal material 6, producing a metal oxide material 6' over the metal material 6. The metal oxide material 6' is shown in FIG. 1 in dashed lines. The metal oxide material 6' may form as a layer or other three-dimensional configuration on the metal material 6, passivating the underlying metal material 6. The ozone in the oxidizing solution may also oxidize the metal nitride material 4. Due to the pH of the oxidizing solution, the metal oxide material 6' may be substantially insoluble in the oxidizing solution. Since the metal material 6 is passivated by the metal oxide material 6', the metal material 6 may be protected by the metal oxide material 6', decreasing the etch rate of the metal material 6. However, the metal nitride material 4 and the oxidized portion thereof may remain soluble in the oxidizing solution, enabling selective removal of the metal nitride material 4. Without being bound to a particular theory, the additive in the oxidizing solution may enable the oxidizing solution to remove the metal nitride material 4 at a faster rate than the metal oxide material 6' or the metal material 6, providing selectivity modulation. It is believed that the additive may also alter the solubility of the metal oxide material 6' in the oxidizing solution. By way of example, if the metal material 6 is tungsten and the metal nitride material 4 is titanium nitride, the oxidizing solution may oxidize a portion of the tungsten to tungsten trioxide ($WO_3$), which is insoluble in the oxidizing solution. However, the titanium nitride or its oxide remains soluble in the oxidizing solution and, therefore, is removed. In comparison, if the additive is not present in the oxidizing solution (i.e., the oxidizing solution includes water and ozone), the metal material 6 may be etched at a substantially faster rate than the metal nitride material 4.

Since the oxidizing solution may be prepared and applied to the semiconductor device structure 2 in a point-of-use (POU) tank, the reagents (water, ozone, and the additive) may be constantly refreshed, which reduces cross-contamination in the tank. Utilizing methods according to embodiments of the present invention may provide a low-cost method of selectively removing the metal nitride material 4 due to the low cost of the reagents and the low concentration of ozone and additive in the oxidizing solution. The methods according to embodiments of the present invention may also provide high efficiency and selectivity in etching the metal nitride material 4 without etching the metal material 6.

The following examples serve to explain embodiments of the present invention in more detail. These examples are not to be construed as being exhaustive or exclusive as to the scope of this invention.

EXAMPLES

Example 1

Test articles including exposed titanium nitride structures and exposed tungsten structures were contacted with oxidizing solutions having the components listed in Table 1. The test articles included an exposed titanium nitride liner and an exposed tungsten contact on a semiconductor substrate, similar to the semiconductor device structure illustrated in FIG. 1. For oxidizing solutions B-H, each of the components listed in Table 1 was sequentially injected into a tank containing the test article, subjecting the test article to the oxidizing solution having the desired concentration of components.

TABLE 1

Components of the Oxidizing Solution

| Oxidizing Solution | Component | Amount | Exposure Time (minutes) |
|---|---|---|---|
| A (control) | $O_3$ and DI $H_2O$ | 40 ppm $O_3$ in DI $H_2O$ | 64 |
| B | $O_3$ and DI $H_2O$ | 10 ppm $O_3$ in DI $H_2O$ | 32 |
|   | $O_3$, DI $H_2O$, and HF | 10 ppm $O_3$ and 100:1 HF in DI $H_2O^a$ | |
|   | $O_3$ and DI $H_2O$ | 10 ppm $O_3$ in DI $H_2O$ | |
|   | $O_3$, DI $H_2O$, and HF | 10 ppm $O_3$ and 100:1 HF in DI $H_2O^a$ | |
| C | $O_3$ and DI $H_2O$ | 10 ppm $O_3$ in DI $H_2O$ | 32 |
|   | $O_3$, DI $H_2O$, and $NH_4OH$ | 10 ppm $O_3$ and 1% $NH_4OH$ in DI $H_2O^d$ | |
|   | $O_3$ and DI $H_2O$ | 10 ppm $O_3$ in DI $H_2O$ | |
|   | $O_3$, DI $H_2O$, and $NH_4OH$ | 10 ppm $O_3$ and 1% $NH_4OH$ in DI $H_2O^d$ | |
| D | $O_3$ and DI $H_2O$ | 10 ppm $O_3$ in DI $H_2O$ | 16 |
|   | $O_3$ and DI $H_2O$ | 10 ppm $O_3$ in DI $H_2O$ | |
|   | $O_3$, DI $H_2O$, HF, and HCl | 10 ppm $O_3$, 100:1 HF, and 1 wt % HCl in DI $H_2O^{a,c}$ | |
|   | $O_3$ and DI $H_2O$ | 10 ppm $O_3$ in DI $H_2O$ | |

TABLE 1-continued

Components of the Oxidizing Solution

| Oxidizing Solution | Component | Amount | Exposure Time (minutes) |
|---|---|---|---|
| | $O_3$ and DI $H_2O$ | 10 ppm $O_3$ in DI $H_2O$ | |
| | $O_3$, DI $H_2O$, HF, and HCl | 10 ppm $O_3$, 100:1 HF, and 1 wt % HCl in DI $H_2O^{a,c}$ | |
| E | $O_3$ and DI $H_2O$ | 10 ppm $O_3$ in DI $H_2O$ | 16 |
| | DI $H_2O$ | | |
| | HF | 500:1 HF$^b$ | |
| | DI $H_2O$ | | |
| | $O_3$ and DI $H_2O$ | 10 ppm $O_3$ in DI $H_2O$ | |
| F | $O_3$ and DI $H_2O$ | 10 ppm $O_3$ in DI $H_2O$ | 32 |
| | $O_3$, DI $H_2O$, and HCl | 10 ppm $O_3$ and 5 wt % HCl in DI $H_2O^c$ | |
| | $O_3$ and DI $H_2O$ | 10 ppm $O_3$ in DI $H_2O$ | |
| | $O_3$, DI $H_2O$, and HCl | 10 ppm $O_3$ and 5 wt % HCl in DI $H_2O^c$ | |
| G | $O_3$ and DI $H_2O$ | 10 ppm $O_3$ in DI $H_2O$ | 2 |
| | HF | 500:1 HF$^b$ | |
| | $O_3$ and DI $H_2O$ | 10 ppm $O_3$ in DI $H_2O$ | |
| | HF | 500:1 HF$^b$ | |
| | $O_3$ and DI $H_2O$ | 10 ppm $O_3$ in DI $H_2O$ | |
| | HF | 500:1 HF$^b$ | |
| | $O_3$ and DI $H_2O$ | 10 ppm $O_3$ in DI $H_2O$ | |
| | HF | 500:1 HF$^b$ | |
| | $O_3$ and DI $H_2O$ | 10 ppm $O_3$ in DI $H_2O$ | |
| | $O_3$ and DI $H_2O$ | 10 ppm $O_3$ in DI $H_2O$ | |
| H | $O_3$ and DI $H_2O$ | 10 ppm $O_3$ in DI $H_2O$ | 2 |
| | HF | 500:1 HF$^b$ | |
| | $O_3$ and DI $H_2O$ | 10 ppm $O_3$ in DI $H_2O$ | |
| | HF | 500:1 HF$^b$ | |
| | $O_3$ and DI $H_2O$ | 10 ppm $O_3$ in DI $H_2O$ | |
| | HF | 500:1 HF$^b$ | |
| | $O_3$ and DI $H_2O$ | 10 ppm $O_3$ in DI $H_2O$ | |
| | HF | 500:1 HF$^b$ | |

$^a$100:1 HF refers to a solution of 1 part HF diluted in 100 parts DI $H_2O$
$^b$500:1 HF refers to a solution of 1 part HF diluted in 500 parts DI $H_2O$
$^c$HCl is commercially available as 29 wt % HCl in water
$^d$$NH_4OH$ is commercially available as 28 wt % $N_4OH$ in water For each of oxidizing solutions B-H, which included the additive or additives, the metal nitride material of the test article was etched at a faster rate than the metal material. In comparison, for oxidizing solution A (the control), the metal material of the test article was etched at a significantly faster etch rate than the metal nitride material.

Example 2

Figure 2:
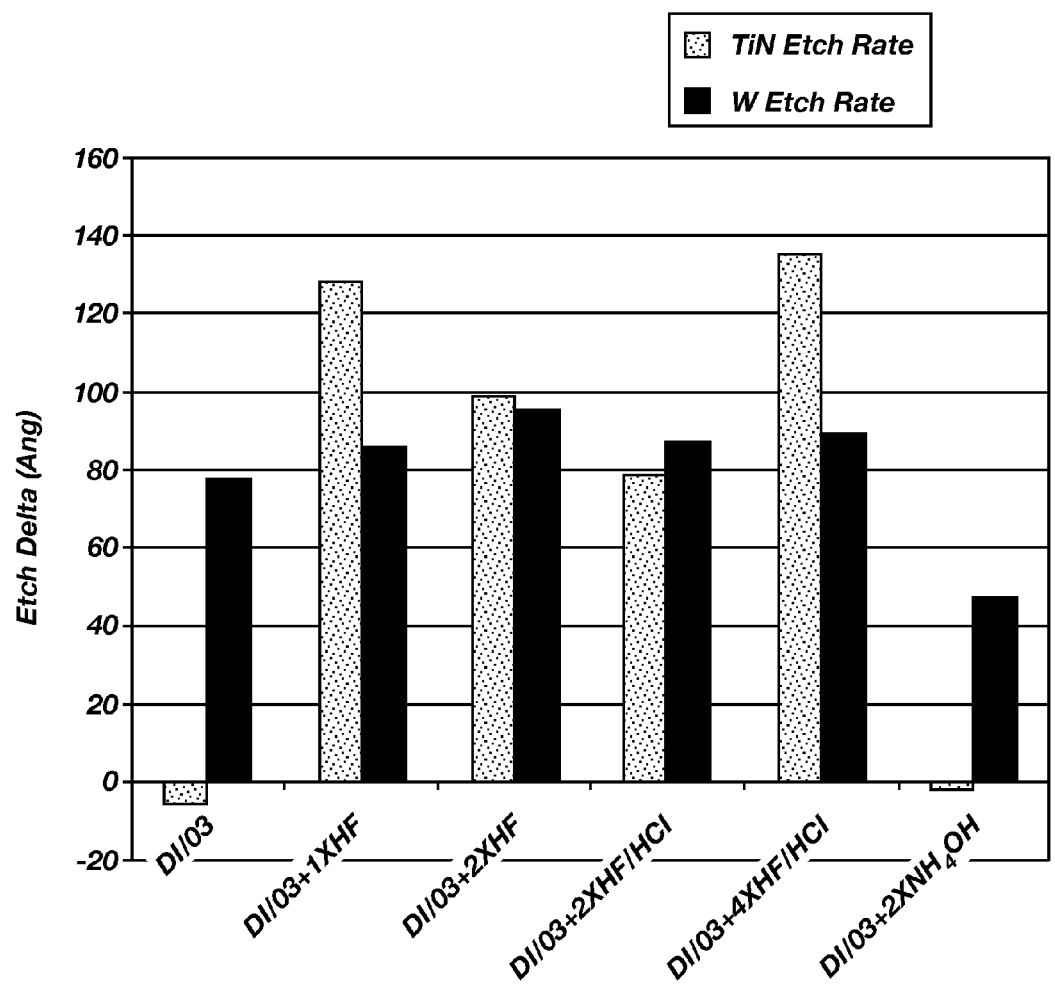
FIG. 2 is a plot showing the change in etch rate selectivity for titanium nitride and tungsten materials upon addition of an additive (hydrogen fluoride, hydrogen fluoride and hydrogen chloride, or ammonium hydroxide) to a solution of deionized water (DI $H_2O$) and ozone.

A plot showing the change in etch rate selectivity for titanium nitride and tungsten materials upon addition of an additive (hydrogen fluoride, hydrogen fluoride and hydrogen chloride, or ammonium hydroxide) to a solution of DI $H_2O$ and ozone is shown in FIG. 2. Test articles as described in Example 1 were subjected to oxidizing solutions having the additive or lacking the additive. The solution of DI $H_2O$ and ozone (labeled "DI/O3" in FIG. 2) included 10 ppm $O_3$ in DI $H_2O$. The solution of DI $H_2O$, ozone, and hydrogen fluoride (labeled "DI/O3+1XHF" in FIG. 2) included 10 ppm $O_3$ in DI $H_2O$ and 1 part HF diluted in 100 parts DI $H_2O$. The solution of DI $H_2O$, ozone, and hydrogen fluoride (labeled "DI/O3+2XHF" in FIG. 2) included 10 ppm $O_3$ in DI $H_2O$ and 1 part HF diluted in 100 parts DI $H_2O$. The solution of DI $H_2O$, ozone, hydrogen fluoride, and hydrogen chloride (labeled "DI/O3+2XHF/HCl" in FIG. 2) included 10 ppm $O_3$ in DI $H_2O$, 1 part HF diluted in 100 parts DI $H_2O$, and 1 wt % hydrogen chloride. The solution of DI $H_2O$, ozone, hydrogen fluoride, and hydrogen chloride (labeled "DI/O3+4XHF/HCl" in FIG. 2) included 10 ppm $O_3$ in DI $H_2O$, 1 part HF diluted in 100 parts DI $H_2O$, and 1 wt % hydrogen chloride. The solution of DI $H_2O$, ozone, and ammonium hydroxide (labeled "DI/O3+2XNH$_4$OH" in FIG. 2) included 10 ppm $O_3$ in DI $H_2O$ and 1% $NH_4OH$ in DI $H_2O$. For the oxidizing solutions including "2x" or "4x" in the label, the total exposure time was the same as that of the oxidizing solutions including "1x" in the label except that the exposure time was divided into two or four equal intervals, respectively. Therefore, test articles exposed to the oxidizing solutions including "2x" or "4x" in the label were exposed to the oxidizing solutions two times or four times, respectively.

After contact with the oxidizing solutions for the amounts of time indicated in Table 1, the etch delta of the tungsten material and titanium nitride material on the test articles were determined by conventional techniques. The change in etch rate (etch delta) was measured and plotted, as shown in FIG. 2.

The solution of DI $H_2O$ and ozone (control) had no or a negative etch rate for titanium nitride. However, upon the addition of the additive or additives (hydrogen fluoride, hydrogen fluoride and hydrogen chloride, or ammonium hydroxide), the etch rate selectivity improved. When hydrogen fluoride was added to the solution of DI $H_2O$ and ozone, the etch rate of titanium nitride was comparable or higher than tungsten. When ammonium hydroxide was added to the solution of DI $H_2O$ and ozone, the etch rate selectivity of titanium nitride was zero, however the etch rate of tungsten was also reduced.

CONCLUSION

In one embodiment, the present invention includes a method of removing a metal nitride material that comprises forming a semiconductor device structure comprising an exposed metal material and an exposed metal nitride material. The semiconductor device structure is subjected to a solution comprising water, ozone, and at least one additive to remove the exposed metal nitride material at a substantially greater rate than the exposed metal material.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of removing a metal nitride material, comprising:
   forming a semiconductor device structure comprising an exposed metal material and an exposed metal nitride material; and
   subjecting the semiconductor device structure to a solution comprising water, ozone, and at least one additive to remove the exposed metal nitride material at a substantially greater rate than the exposed metal material.

2. The method of claim 1, wherein forming a semiconductor device structure comprising an exposed metal material and an exposed metal nitride material comprises forming a semiconductor device structure comprising an exposed tungsten feature and an exposed titanium nitride feature.

3. The method of claim 1, wherein forming a semiconductor device structure comprising an exposed metal material and an exposed metal nitride material comprises forming a tungsten plug and a titanium nitride liner on a substrate.

4. The method of claim 1, wherein subjecting the semiconductor device structure to a solution comprising water, ozone, and at least one additive comprises contacting the semiconductor device structure with the solution comprising water, ozone, and at least one additive selected from the group consisting of hydrochloric acid, hydrogen fluoride, ammonium hydroxide, tetramethylammonium hydroxide, and hydrogen peroxide.

5. The method of claim 1, wherein subjecting the semiconductor device structure to a solution comprising water, ozone, and at least one additive comprises contacting the semiconductor device structure with the solution comprising water, ozone, and hydrogen fluoride.

6. The method of claim 1, wherein subjecting the semiconductor device structure to a solution comprising water, ozone, and at least one additive comprises contacting the semiconductor device structure with the solution comprising water, ozone, hydrogen fluoride, and hydrogen chloride.

7. The method of claim 1, wherein subjecting the semiconductor device structure to a solution comprising water, ozone, and at least one additive comprises contacting the semiconductor device structure with the solution consisting of water, ozone, and at least one additive.

8. The method of claim 1, wherein subjecting the semiconductor device structure to a solution comprising water, ozone, and at least one additive to remove the exposed metal nitride material at a substantially greater rate than the exposed metal material comprises etching the exposed metal nitride material without substantially etching the exposed metal material.

9. The method of claim 1, wherein forming a semiconductor device structure comprising an exposed metal material and an exposed metal nitride material comprises forming a semiconductor device structure comprising an exposed titanium feature, an exposed vanadium feature, an exposed nickel feature, an exposed copper feature, an exposed zinc feature, an exposed zirconium feature, an exposed niobium feature, an exposed molybdenum feature, an exposed ruthenium feature, an exposed rhodium feature, an exposed cadmium feature, an exposed lanthanum feature, an exposed hafnium feature, an exposed tantalum feature, or an exposed tungsten feature.

10. The method of claim 1, wherein forming a semiconductor device structure comprising an exposed metal material and an exposed metal nitride material comprises forming a semiconductor device structure comprising an exposed titanium nitride feature, an exposed tantalum nitride feature, or an exposed tungsten nitride feature.

11. The method of claim 1, wherein forming a semiconductor device structure comprising an exposed metal material and an exposed metal nitride material comprises forming the exposed metal nitride material in contact with sidewalls of an insulative material and an exposed surface of a semiconductor substrate and the exposed metal material in contact with sidewalls and a horizontal portion of the exposed metal nitride material.

12. The method of claim 1, wherein subjecting the semiconductor device structure to a solution comprising water, ozone, and at least one additive to remove the exposed metal nitride material at a substantially greater rate than the exposed metal material comprises oxidizing the exposed metal material and the exposed metal nitride material.

13. The method of claim 1, wherein subjecting the semiconductor device structure to a solution comprising water, ozone, and at least one additive comprises subjecting the semiconductor device structure to the solution at a temperature of from approximately 20° C. to approximately 25° C.

14. The method of claim 1, wherein subjecting the semiconductor device structure to a solution comprising water, ozone, and at least one additive comprises subjecting the semiconductor device structure to the solution having a pH of less than approximately 4.

15. A method of removing a metal nitride material, comprising:
    forming a semiconductor device structure comprising an exposed transition metal material and an exposed metal nitride material; and
    subjecting the semiconductor device structure to a solution comprising water, ozone, and at least one additive to remove the exposed metal nitride material without removing the exposed transition metal material.

16. The method of claim 15, wherein forming a semiconductor device structure comprising an exposed transition metal material and an exposed metal nitride material comprises forming the exposed transition metal material from titanium, vanadium, nickel, copper, zinc, zirconium, niobium, molybdenum, ruthenium, rhodium, cadmium, lanthanum, hafnium, tantalum, or tungsten.

\* \* \* \* \*